(12) United States Patent
Ogirko

(10) Patent No.: US 12,375,098 B1
(45) Date of Patent: Jul. 29, 2025

(54) SIGMA-DELTA MODULATOR FOR CAPACITIVE TOUCH SENSING CHANNEL

(71) Applicant: Cypress Semiconductor Corporation, San Jose, CA (US)

(72) Inventor: Roman Ogirko, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 18/667,543

(22) Filed: May 17, 2024

(51) Int. Cl.
*H03M 3/00* (2006.01)
*G06F 3/044* (2006.01)

(52) U.S. Cl.
CPC ............ *H03M 3/39* (2013.01); *G06F 3/0446* (2019.05); *G06F 2203/04111* (2013.01)

(58) Field of Classification Search
CPC .................... H03M 3/39; G06F 3/0446; G06F 2203/04111
See application file for complete search history.

(56) References Cited

U.S. PATENT DOCUMENTS

| | | | | |
|---|---|---|---|---|
| 6,970,126 B1* | 11/2005 | O'Dowd | .................. | H03M 3/34 341/172 |
| 9,859,916 B1* | 1/2018 | Verdant | .................... | H03M 3/50 |
| 10,554,218 B1* | 2/2020 | Seesink | .................. | H03M 3/458 |
| 11,442,578 B2* | 9/2022 | Maharyta | .............. | G06F 3/0418 |
| 11,467,693 B1* | 10/2022 | Maharyta | ................ | G06F 3/045 |
| 2016/0265995 A1* | 9/2016 | Wang | ........................ | H03M 3/39 |
| 2017/0343386 A1* | 11/2017 | Tanaka | ............... | G01R 27/2605 |
| 2018/0004317 A1* | 1/2018 | Bohannon | ............... | G06F 3/041 |
| 2019/0149163 A1* | 5/2019 | Bohannon | ............ | H03K 17/962 345/174 |
| 2021/0226626 A1* | 7/2021 | Ogirko | ................ | G06F 3/04182 |
| 2021/0305995 A1* | 9/2021 | Wang | .................... | H03M 3/402 |
| 2022/0196437 A1* | 6/2022 | Maharyta | ............. | H03K 17/952 |
| 2022/0360275 A1* | 11/2022 | Maharyta | ............. | H03M 3/458 |

* cited by examiner

*Primary Examiner* — Amy Onyekaba

(57) ABSTRACT

An integrated circuit includes a sigma-delta modulator coupled to a receive electrode of a capacitive touch screen sensor and including a first single-ended integrator and a second single-ended integrator selectively coupled to an output of the first single-ended integrator. A latch is coupled to an output of the second single-ended integrator and driven by a frequency modulation signal. A balancing circuit is selectively coupled to a first input of the first single-ended integrator and to a second input of the second single-ended integrator. Logic is coupled to the balancing circuit and causes, based on the frequency modulation signal and an output value of the latch, the balancing circuit to one of: apply a positive balancing current to the first input and a negative balancing current to the second input; or apply a positive balancing current to the second input and a negative balancing current to the first input.

20 Claims, 12 Drawing Sheets

SIGMA-DELTA MODULATOR FOR CAPACITIVE TOUCH SENSING CHANNEL

BACKGROUND

Devices and systems, such as mobile communications devices, can include various sensing devices such as touchscreens (e.g., touch panels) and buttons. The touchscreens and buttons can utilize one or more sensing modalities to receive the inputs from an entity, such as from a user of a mobile communications device. An example of such a modality can include capacitive (or other) sensing in which a touchscreen or button can include conductive elements, which can be used to obtain measures of various capacitances (or other parameters).

For example, a touch panel sensor can include an array of electrodes and a touchscreen controller can be used to measure capacitances (or other phenomena) associated with those electrodes. The automotive touch sensing applications require high-sensitivity to support thick overlay, operation with gloved hand, and operation at noisy conditions generated by a display screen. Meeting these requirements can be especially challenging if sensing is performed on a unit cell sensor located close to the display components, while switching inductive loads, and/or while being exposed to radio emission or other electromagnetic interference. In addition, the emission of the touch panel sensor is limited, which limits the excitation energy of the touch panel sensor, making it difficult to achieve sufficient signal-to-noise ratio (SNR).

BRIEF DESCRIPTION OF THE DRAWINGS

The disclosure is illustrated by way of example, and not of limitation, in the figures of the accompanying drawings.

DETAILED DESCRIPTION

Figure 1:
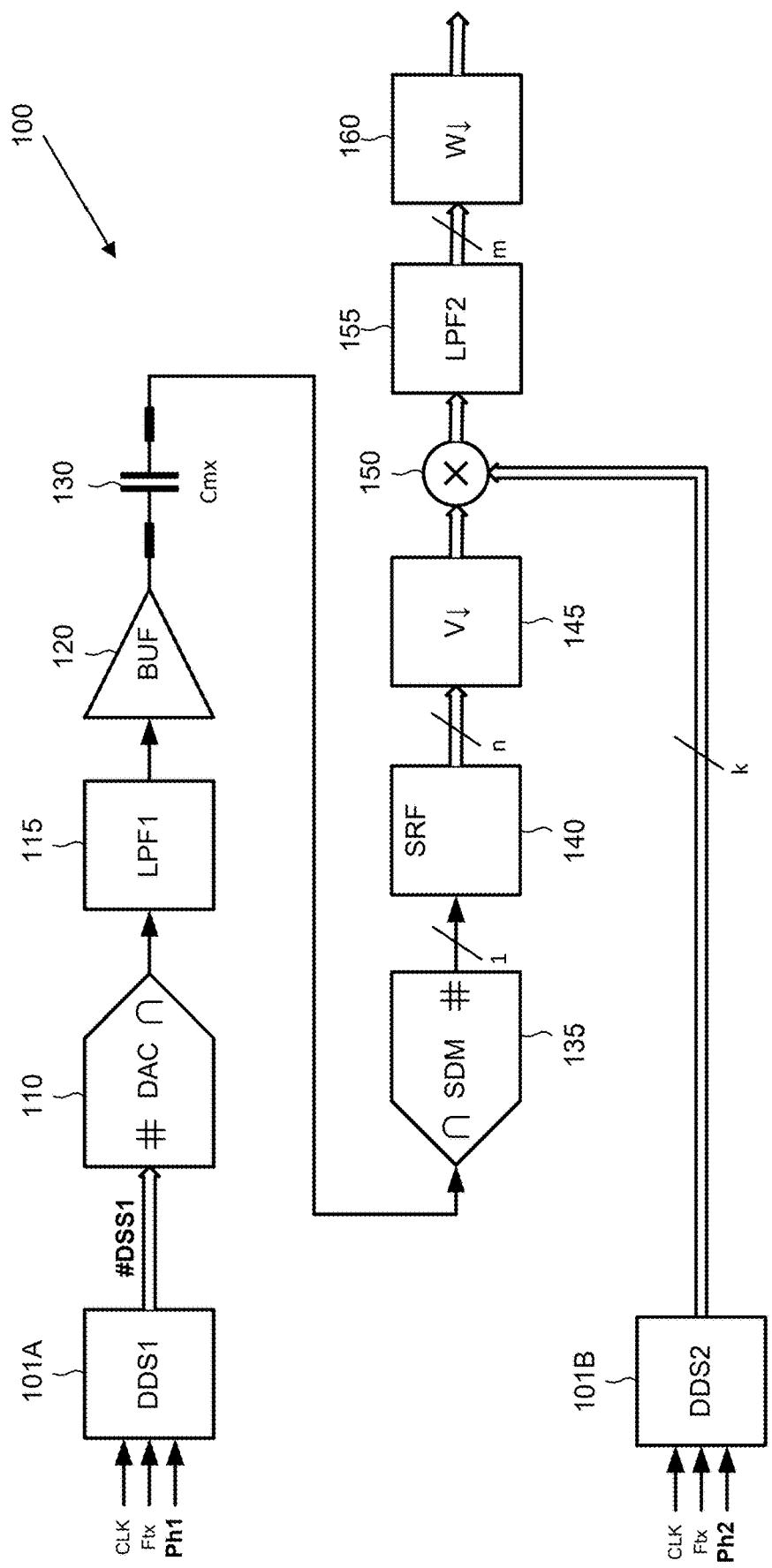
FIG. 1 is a schematic block diagram of a capacitance measurement channel according to some embodiments.

The following description sets forth numerous specific details such as examples of specific systems, components, methods, and so forth, in order to provide a good understanding of various embodiments of the techniques described herein for a sigma-delta modulator for a capacitive touch sensing channel. It will be apparent to one skilled in the art, however, that at least some embodiments can be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations can vary from these exemplary details and still be contemplated to be within the scope of the present disclosure.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which can also be referred to herein as "examples," are described in enough detail to enable those skilled in the art to practice the embodiments of the claimed subject matter described herein. The embodiments can be combined, other embodiments can be utilized, or structural, logical, and electrical changes can be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for simplifying the normal complexity of a sigma-delta modulator of a capacitive measurement channel with particular benefit to reducing the channel size in a multi-channel touch sensing system. While the present embodiments are applied more specifically to vehicle touch screens by way of example, they are applicable to a wide range of applications where there is a need to measure a small capacitance or other physical parameter change in the presence of other large non-informative component(s) that can be removed. In addition to touch panels generally, the present embodiments are also applicable to water level sensors, capacitive position sensors, proximity sensors, fuel level meters, inductive sensors, and the like. In various embodiments, the disclosure is designed to work with sensors that use sinusoidal excitation signals to keep overall sensor emissions low, however, the disclosure can be adapted for use with other operational waveforms. As was discussed previously, it may be difficult to meet a high SNR requirement in capacitive touch channel measurement systems.

FIG. 1 is a schematic block diagram of a capacitance measurement channel 100 according to some embodiments. Some modern narrowband measurement channels, such as the one illustrated in FIG. 1, are based on an analog-to-digital converter (ADC) with high oversampling, followed by synchronous demodulation, which is provided by multiplying the output signal of the ADC by a sinusoidal signal at the frequency of the excitation signal, and averaging the demodulated signal with a low-pass filter (LPF). More specifically, the capacitance measurement channel 100 may include a first direct digital synthesis (DDS) generator 101A to generate a sine wave, which excites the capacitance measurement channel 100, including a unit cell sensor 130, which represents one cross-section of an transmit (Tx) electrode and a receive (Rx) electrode in a touch panel sensor. In some embodiments, the sine wave in digital form is converted to analog form using a digital-to-analog converter (DAC) 110, which are then processed by a first LPF 115, e.g., to suppress quantization noise generated by the DAC 110. In embodiments, a buffer 120 is interposed between the first LPF 115 and the unit cell sensor 130, the buffer 120 to drive a capacitive load of the Tx line represented here by the unit cell sensor 130.

In some embodiments, the analog frontend on the receive side, which is coupled to the unit cell sensor 130, includes a sigma-delta (ΖΑ) modulator (or SDM 135), a signal reconstruction filter (or SRF 140), a first down sampler 145, a multiplier 150, a second LPF 155, and a second down sampler 160. In embodiments, the SDM 135 is a high-oversampling-rate ADC configured to reduce the ADC complexity. The capacitive measurement channel 100 may further include a second DSS 101B, which may generate a second sine wave (e.g., that is out of phase with the original sine wave generated by the first DSS 101A), which is demodulated by the multiplier 150 with the output of the first down sampler 145. This demodulated signal may be processed by the second LPF 155 and the second down sampler 160 before being sent to post-processing a host system (not illustrated). In embodiments, double the passband of the second LPF 155 determines the passband of the capacitance measurement channel 100. In some embodiments, the capacitive measurement channel 100 of FIG. 1 is duplicated for each channel corresponding to respective Tx and Rx electrodes, so any additional complexity in a channel is multiplied by the number of channels.

Some touch sensing systems use a measurement channel based on a charge transferring method employing double-slope integrating ADC with a quantization error accumulation structure. This structure may include two integrators formed by a current-to-current converter loaded with integrating capacitors. In such touch sensing system, integrators may collect the charge transmitted through the sensor during a corresponding half-period of the rectangular excitation signal. The results of the half-period conversions may be accumulated making measurements insensitive to DC offsets inside the capacitive measurement channel. A major disadvantage of this structure is the rectangular measurement window, which leads to aliasing lobes at odd harmonics of carrier frequency of the excitation signal. These aliasing lobes reduce the noise immunity of the measurement channel, which can be a significant challenge in a design environment that demands strong noise immunity for successful capacitive measurement for reasons already discussed.

Aspects of the present disclosure address the above and other deficiencies through providing an integrated circuit, sensing device or system, and/or method that employs an ADC such as the SDM 135 in the receive analog frontend, and simplifying the design of the SDM 135 to reduce the size of each capacitive measurement channel. One approach to solving these difficulties is to create a system based on a narrowband measurement channel. Narrowband means both narrowband emission and narrowband measurement. Narrowband radiation may be achieved by exciting the sensor with a sinusoidal signal.

In some cases, modern narrowband measurement channels are based on an ADC with high oversampling, followed by synchronous demodulation, which is provided by multiplying the output signal of the ADC by a sinusoidal signal at the frequency of the excitation signal, and averaging the demodulated signal with a low-pass filter (LPF). The SDM 135 may be used as an ADC with high oversampling and can be designed with smaller capacitors in the picofarad (pF) range (e.g., 1-3 pF) when using sinewave excitation. A high-order sigma-delta modulator may be preferably used to reduce quantization noise. Since, in touch screen applications, the measurement channel switches between multiple sensors during the scan time, the measurement time is limited. This can be a prominent feature of the operation of the ADC in some applications. In some optimal solutions, according to the criterion of resolution and SDM size, is a second-order SDM.

The most common design of a second-order SDM is the use of discrete-time structures based on differential integrators. This second-order SDM may include two cascades connected in series. The output of the latter may be connected to a comparator that forms a feedback loop for balancing the integrators. More complex feedback structures are not suitable for use due to the need to achieve steady operation after switching the sensor when the measurement time is limited.

The advantage of this common solution is insensitivity to pulsations in the supply rails, which is provided by the differential structure. However, this common solution leads to an increase in the size of the SDM 135 due to the use of an increased size of the full differential operational amplifier, ten analog switches, and four capacitors for each SDM 135. This SDM design does not significantly increase the size of the silicon if there are just a few SDMs. But, in touchscreen applications, the number of channels ranges from 60 to over 100. In this case, increasing the size of each SDM 135 significantly affects the size of the silicon. Therefore, reducing the size of each SDM 135 on chip may significantly decrease the overall size of the analog frontend on silicon.

Aspects of the present disclosure address the above and other deficiencies of the common SDM design through simplifying the SDM 135 to reduce its size by reducing the number of components while maintaining operational ability. Since a touch screen sensor is single-ended, the differential architecture of the common SDM design may be considered excessive. This makes it possible to reduce size of the operational amplifiers (op-amps), turning the operational amplifier into single-ended ones. Use of single-ended op-amps may also change a current-balancing chain, simultaneously reducing the number of switches and preventing discharging the balancing capacitor through the bias voltage source that is used as a virtual ground for the operational amplifier. Current-balancing chains may be required in order to move charge from a fast-charging capacitor to another capacitor to be read out, e.g., for conversion to a digital value.

In the common SDM design, the traditional balancing chain applies the balancing capacitor to the differential input of the op-amp that causes spikes of current through the bias voltage source applied to a non-inverting input of the single-ended op-amp. Since the output impedance of the op-amp is not zero, these current spikes generate a bias voltage change that distorts the measurement results. It may, therefore, be sufficient to shape input current to some range and then perform capacitive measurements, e.g., a tunable capacitor on the input may not be necessary. In this way, the optimized SDM design may directly apply a continuous-time, current-to-current converter and perform sampling from a first integrator to a second integrator, as will be discussed in more detail.

Therefore, advantages of the systems and methods implemented in accordance with some embodiments of the present disclosure include, but are not limited to, simplification of the SDM to include a single-ended architecture that reduces the size of the operational amplifiers as well as the number of switches and capacitors. The design approach may also be used in modified differential designs in order to also reduce the number of switches and capacitors in these designs, e.g., which can be employed in differential architectures. In this way, the present embodiments reduce the channel size of each of multiple capacitive measurement channels in a multi-channel system. Other advantages will be apparent to those skilled in the art of capacitive measurement channel design discussed hereinafter.

Figure 2:
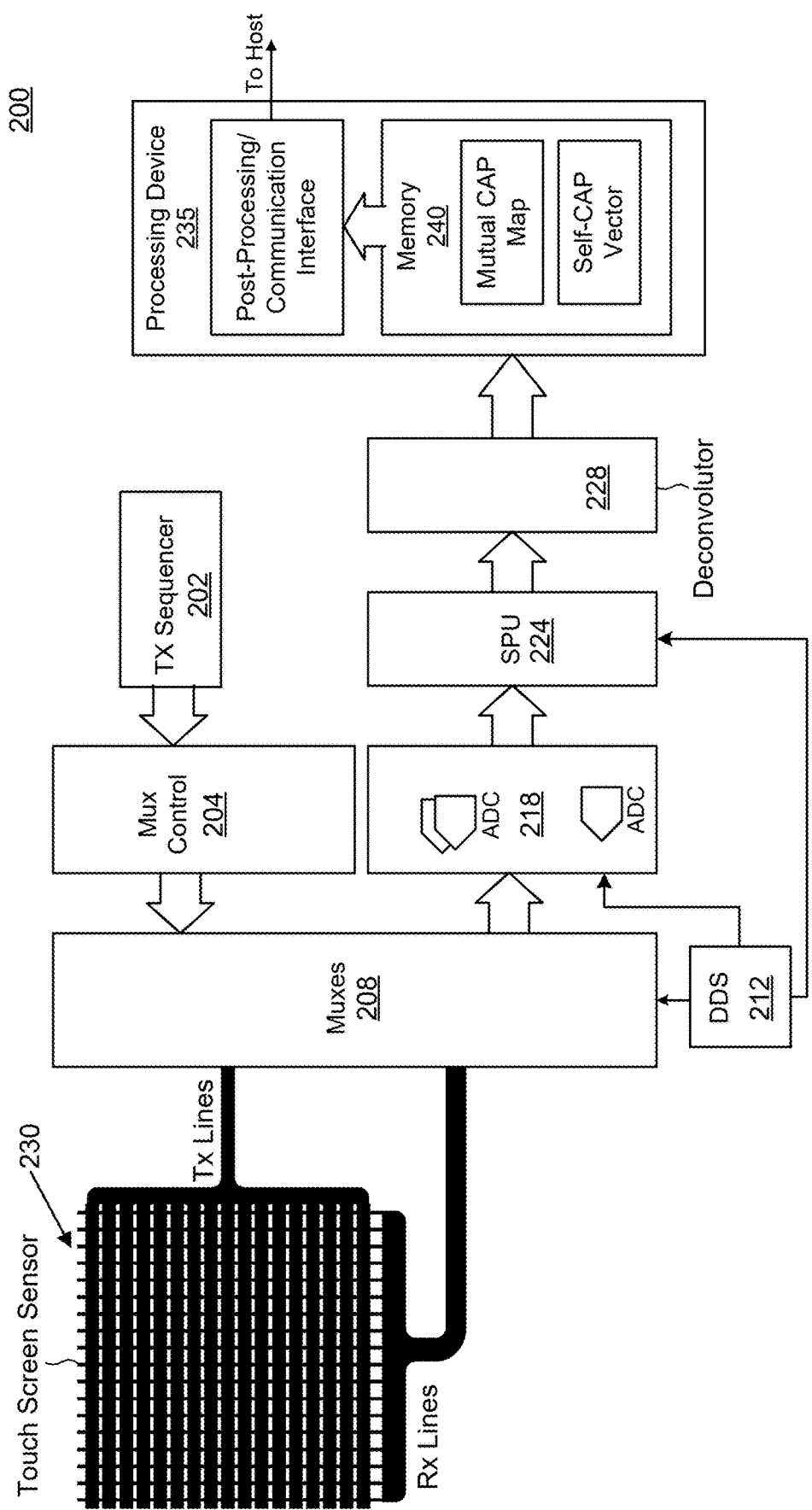
FIG. 2 is a schematic block diagram of a system for sensing a touch screen sensor according to some embodiments.

FIG. 2 is a schematic block diagram of a system 200 (or sensing device) for sensing a touch screen sensor according to some embodiments. In some embodiments, the system 200 (or device) includes a the touch screen sensor 230 that is formed by an orthogonal grid of electrodes, the Tx and Rx electrodes referred to earlier. In embodiments, each cross-section of a Tx and an Rx electrode is a unit cell sensor that can be individually measured; thus, the touch screen sensor 230 may be composed of multiple unit cell sensors. A Tx sequencer 202 may control the excitation of the Tx electrodes through a plurality of Rx lines, e.g., in connection with a multiplexer controller 204. A multiplexer group 208 may include two multiplexers, one for controlling the Tx electrodes and another for controlling the Rx electrodes. A DDS generator 212 can be employed to generate the sine waves used for electrode excitation, as discussed herein.

In some embodiments, the system 200 further includes an ADC group 218 having individual ADCs for each capacitive measurement channel (e.g., each ADC coupled to a respective Rx electrode through a respective Rx line and Rx multiplexer). In some embodiments, the ADCs of the ADC group 218 are sigma-delta modulators (SDMs), but other types of ADCs are envisioned. In some embodiments, the system 200 also includes a signal processing unit or SPU 224 having respective SRFs coupled to respective ADCs. The SPU 223 can demodulate and filter the digital signals received from the respective ADCs to obtain the magnitude of the response from the respective unit cell sensors.

In some embodiments, the system 200 further includes a deconvolutor 228 coupled between the SPU 224 and a processing device 235. The deconvolutor 228 may process the sensor response data by a deconvolution to separate the responses of each cross element of the sensor grid (e.g., distinguish response signals between the unit cell sensors). The processing device 235 can include memory 240, e.g., in which to store the deconvoluted data as a mutual capacitance map and a self-capacitive map. In embodiments, the memory 240 is to store a plurality of measured outputs corresponding to the multiple unit sensors. The processing device 235 can further include code or programs for performing post-processing and sending the measured capacitive data to a host. This code or programs may be firmware, software, or a combination thereof.

Figure 3:
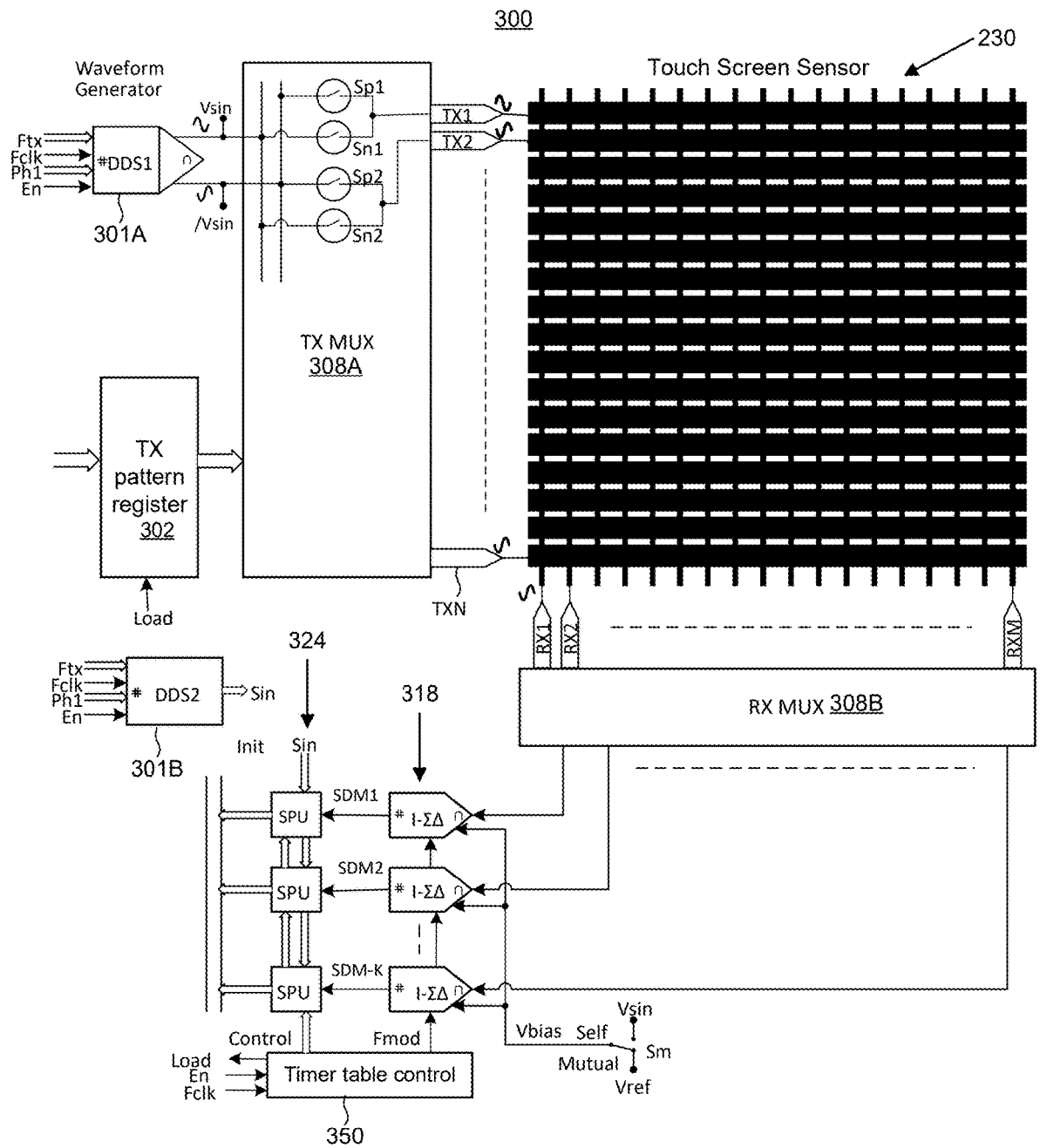
FIG. 3 is a schematic block diagram of an analog frontend of the system of FIG. 2 according to some embodiments.

FIG. 3 is a schematic block diagram of an analog frontend 300 of the system 200 of FIG. 2 according to some embodiments. In various embodiments, the analog frontend 300 includes a first waveform generator 301A, a Tx pattern register 302, a Tx multiplexer 308A, which is coupled to Tx lines and electrodes of the touch screen sensor 230, an Rx multiplexer 308B, which is coupled to the Rx lines and Rx electrodes, a plurality of SDMs 318 coupled to a plurality of SPUs 324, and a second waveform generator 301B to be employed within the SPUs 324 (see the Sin signal).

In some embodiments, the first waveform generator 301A generates excitation signals at the frequency Ftx, including output signals of opposite phase. These excitation signals are passed to the Tx multiplexer 308A where the excitation signals are distributed to the sensor Tx electrodes to form an excitation sequence. In embodiments, the Tx pattern register 302 determines this sequence, which can change during the scan of the unit cell electrodes across the touch screen sensor 230. The excitation through the Tx electrodes generates current in the Rx electrodes. In embodiments, these currents are proportional to the mutual capacitances formed at crossings of the Rx electrodes by the Tx electrodes. The Rx currents may be passed to current-mode SDMs 318 through the Rx multiplexer 308B.

A property of the current-mode input circuit (e.g., associated with the SDMs 318 and the SPUs 324) is a near-zero dynamic input resistance and a constant input voltage (e.g., bias voltage). This property makes it possible to cause the input current to be independent of the capacitance between the Rx electrode and ground (defined as self-capacitance), since this capacitance is not recharged during measurements. Thus, this measurement mode may be referred to as mutual-capacitance measurement mode. Further, the current mode input allows modulation of the bias voltage of the Rx electrode. If the same modulation voltage is applied to the Tx electrodes, the mutual capacitance between the electrodes does not recharge or affect the Rx current. In this case, the current is generated by recharging the self-capacitance of the Rx electrode. This measurement mode may be referred to as self-capacitance measurement mode.

In various embodiments, these two measurement modes are used to detect water droplets on the surface of the touch screen sensor 230. Water drops distort the value of the mutual capacitance, which leads to errors in the recognition of the contact position. But these drops do not affect the value of the self-capacitance. Just placing a finger near the sensor electrodes creates a circuit that makes an extra path from the electrode to ground, which changes a self-capacitance of an electrode. Thus, if a change in the self-capacitance is not detected (without a finger touch), the values of the mutual capacitances can be considered as a base level, even if distorted by water drops. The base level can be subtracted from the next measurement, compensating for mutual capacitance distortion.

In some embodiments, switching to the self-capacitance measurement mode is performed by setting switch (Sm) to the up position and connecting the Tx electrodes to Vsin output by the first waveform generator 302A, e.g., by closing the Sp switches in the Tx multiplexer 308A. In at least some embodiments, the analog frontend 300 within the system 200 works cyclically, changing from mutual capacitance mode to self-capacitance mode and back again to mutual capacitance mode, and so forth. The mutual-capacitance mode stage may include K measurements with different excitation patterns until all the Tx lines (and electrodes) are scanned. At the stage of the self-capacitance mode, one measurement can be performed that measures self-capacitance for the entire touch screen sensor 230. The sequence of stages in the work cycle does not matter. In some embodiments, control logic 350 of the analog frontend 300 can send control and timing signals to the SDMs 318 and SPUs 324, including the Fmod signal and control signals resetting the filters, for decimation, and defining the measurement window (see FIG. 7).

In some embodiments, capacitance is measured over a period of time, which is referred to herein as the measurement window. This measurement window length can determine the channel immunity and SDM resolution, where the longer the measurement window, the better channel immunity and SDM resolution. But the duration of the measurement window can be limited by the duration of the work cycle, which is determined by the data refresh rate of the SDM 318.

Figure 4:
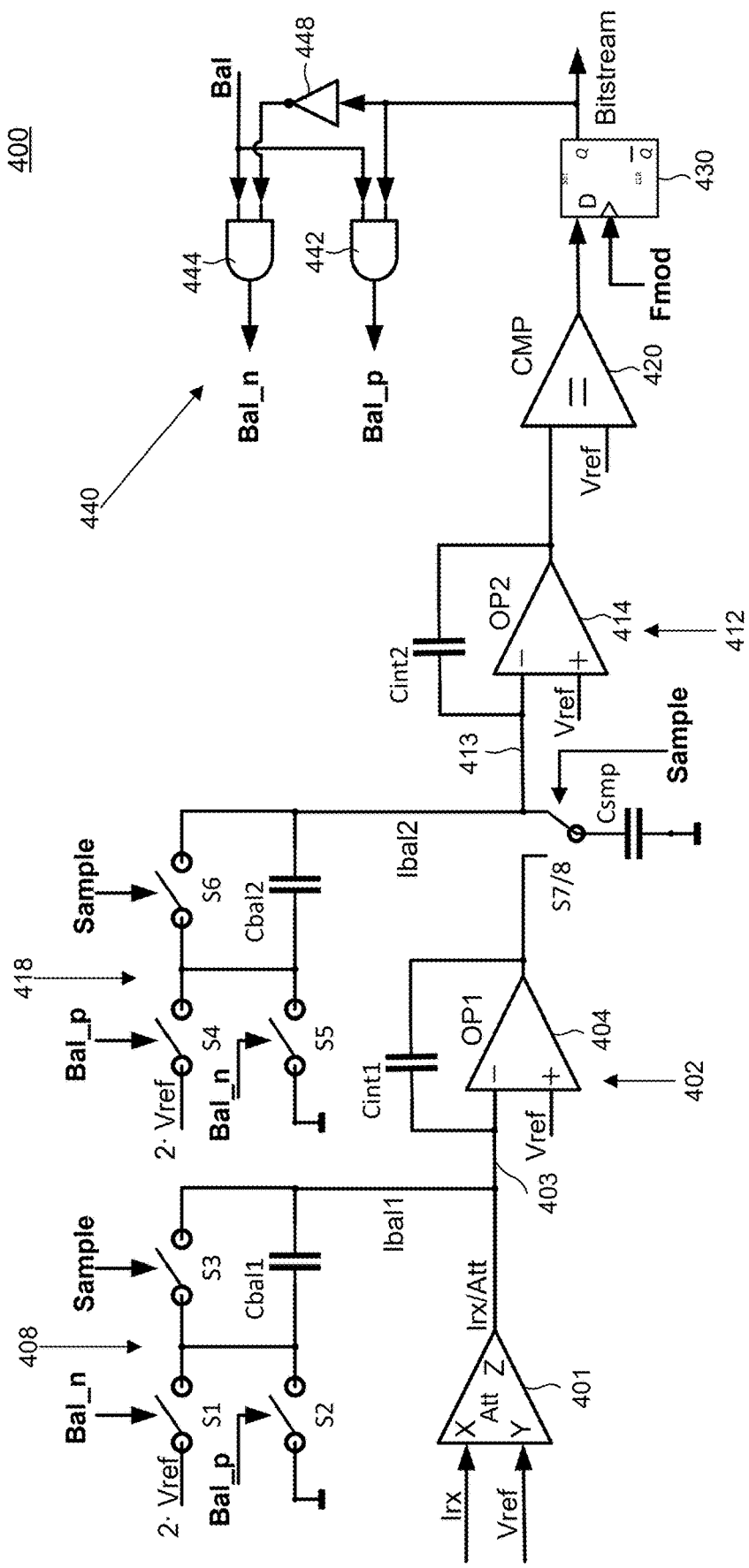
FIG. 4 is a schematic diagram of a sigma-delta modulator (SDM), designed with a single-ended architecture, which can be employed in the analog frontend according to at least one embodiment.
Figure 5:
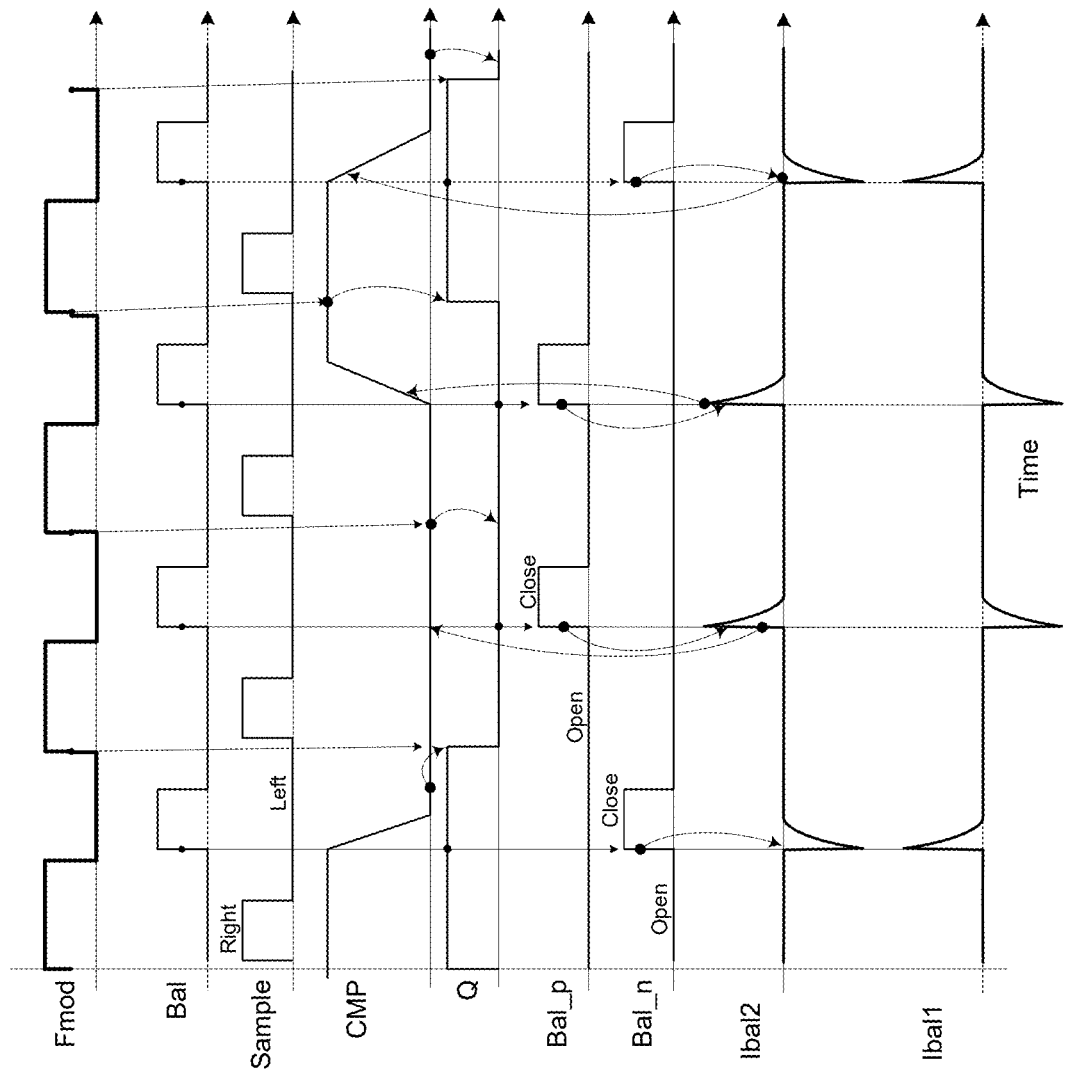
FIG. 5 is a timing diagram graph illustrating waveforms of various operational signals of the SDM of FIG. 4 according to some embodiments.

FIG. 4 is a schematic diagram of a sigma-delta modulator (SDM) 400, designed with a single-ended architecture, which can be employed in the analog frontend 300 according to at least one embodiment. FIG. 5 is a timing diagram graph illustrating waveforms of various operational signals of the SDM 400 of FIG. 4 according to some embodiments. As was discussed, because the touch screen sensor 230 is single-ended, the typical differential architecture may be considered excessive. By modifying the SDM 400 to a single-ended architecture, each capacitive measurement channel (from 60-100 channels) can be simplified, significant silicon area conserved, as well as power conversation achieved.

Thus, in at least some embodiments, the SDM 400 is coupled to a receive electrode of the capacitive touch screen sensor 230 (e.g., through the Rx multiplexer 208B). The SDM 400 can include a first single-ended integrator 402, a first balancing circuit 408 coupled to a first input 403 of the first single-ended integrator 402, a second single-ended integrator 412 selectively coupled to an output of the first single-ended integrator 402, and a second balancing circuit 418 coupled to a second input 413 of the second single-ended integrator 412. In embodiments, the voltage of the first single-ended integrator 402 is sampled into the second single-ended integrator 412 at the frequency modulation (Fmod) frequency, where Fmod may be supplied by the control logic 350, e.g., including a timer table controller. In embodiments, the first balancing circuit 418 provides a first balancing current (Ibal1) to the first input 403 of the first single-ended integrator 402 and the second balancing circuit provides a second balancing current (Ibal2) to the second input 413 of the second single-ended integrator 413.

In embodiments, the term "single-ended" here connotes that each integrator is not being employed differentially, which means one of the input terminals is connected either ground or to a fixed reference voltage (Vref), the latter of which is the case here. Although each non-inverting terminal is illustrated as connected to Vref, it could be connected to ground in alternative embodiments. In some embodiments, Vdd is approximately 2 times Vref (e.g., 2.5V or other Vdd value), so Vref can be derived from an internal Vdd supply voltage. For example, a voltage divider can be employed to half Vdd if Vref is desired, e.g., for positive inputs to operational amplifiers of the first and second single-ended integrators 402 and 412.

In at least some embodiments, the SDM 400 includes a current-to-current converter 401 (e.g., an attenuator) coupled to the receive electrode. In embodiments, the first single-ended integrator 402 is coupled to the current-to-current converter 401, which scales the sensor current to a dynamic range of the SDM 400. This enables the use of one value of balancing capacitors Cbal1 and Cbal2 in the SDM 400 with an ability to tune an attenuation value of the current-to-current converter 401.

In at least some embodiments, the first single-ended integrator 402 includes a first operational amplifier 404 with a non-inverting terminal coupled to the reference voltage and a first integrating capacitor (Cint1) coupled between an output and an inverting terminal of the first operational amplifier 404. In some embodiments, the second single-ended integrator 412 includes a second operational amplifier 414 with a non-inverting terminal coupled to the reference voltage and a second integrating capacitor (Cint2) coupled between an output and an inverting terminal of the second operational amplifier 414.

In some embodiments, the SDM 400 further includes a latch 430 (e.g., a D-latch) coupled to an output of the second single-ended integrator 412, e.g., to temporarily store the measured value output by the second single-ended integrator 412. In embodiments, the SDM 400 further includes a comparator 420 coupled between the output of the second single-ended integrator 412 and an input to the latch 430. In embodiments, the latch 430 is driven by Fmod. Thus, the output value of the second single-ended integrator 412 can be stored in the latch 430 at the rising edge of the Fmod signal, as illustrated in FIG. 5.

The polarity of each balancing current (Ibal1 and Ibal2) is generated to balance (or compensate for) the input current (Irx/Att), so the SDM 400 detects the sampled input signal at the second single-ended integrator 412 and compares the signal with Vref at the comparator 420. An output of the comparator 420 can be temporarily stored by the latch 430, which can then combined with a balancing signal (Bal) to decide which polarity is going to be applied by each balancing circuit.

More specifically, in some embodiments, the SDM 400 includes logic 440 coupled between an output of the latch 430 and a pair of balancing switches (e.g., S1/S2 and S4/S5) of each of the first and second balancing circuits 408 and 418. In embodiments, the logic 440 causes, based on values of a bitstream at the output of the latch 430 and on a balancing signal (Bal), the first balancing circuit 408 to apply the first balancing current (Ibal1) to the first input 403. In embodiments, the logic 440 causes, based on the values of the bitstream at the output of the latch 430 and on the balancing signal (Bal), the second balancing circuit 418 to apply the second balancing current (Ibal2), having an opposite polarity to that of the first balancing current (Ibal1), to the second input 413. Thus, as can be seen in FIG. 5, the Ibal1 and Ibal2 currents are applied concurrently and of opposite polarities, timed off of the balancing signal (Bal).

In some embodiments, the first balancing circuit 408 includes a first switch (S1) coupled to a reference voltage (Vref or two times Vref) and a second switch (S2) coupled to ground, where the first and second switches (S1/S2) are the pair of balancing switches referred to previously. The first balancing circuit 408 can further include a first balancing capacitor (Cbal1) coupled between the first and second switches (S1/S2) and the first input 403. The first balancing circuit 408 can further include a third switch (S3) coupled between the first switch (S1) and the first input 403. In some embodiments, the first switch (S1) charges the first balancing capacitor with a positive charge (to lead to a positive Ibal1), and the second switch (S2) charges the first balancing capacitor with a negative charge (to lead to a negative Ibal1). In embodiments, the third switch (S3) discharges the first balancing capacitor (Cbal1) during the high level of the sampling signal (Sample) before S1 or S2 generates balancing current through the first balancing capacitor (Cbal1).

In some embodiments, the second balancing circuit 418 includes a fourth switch (S4) coupled to the reference voltage (Vref or two times Vref), a fifth switch (S2) coupled to ground, where the fourth and fifth switches (S4/S5) are the pair of balancing switches referred to previously. The second balancing circuit 418 can further include a second balancing capacitor (Cbal2) coupled between the fourth and fifth switches (S4/S5) and the second input 413. The second balancing circuit 418 can further include a sixth switch (S6) coupled between the fourth switch and the second input 413. In some embodiments, the fourth switch (S4) charges the second balancing capacitor with a positive charge (to lead to a positive Ibal2), and the fifth switch (S5) charges the second balancing capacitor with a negative charge (to lead to a negative Ibal2). In embodiments, the sixth switch (S6) discharges the second balancing capacitor (Cbal2) during the high level of the sampling signal (Sample) before S4 or S5 generates balancing current through the second balancing capacitor (Cbal2).

In embodiments, the SDM 400 further includes a single-ended sampling capacitor (Csmp) selectively coupled between the first and second single-ended integrators 402 and 412. The SDM 400 can further include a set of switches (S7/8) coupled between the second input 413, the single-ended sampling capacitor (Csmp), and an output of the first single-ended integrator 402. In embodiments, a sample signal (Sample) is applied to the third switch (S3), the sixth switch (S6), and the set of switches (S7/8) to cause charge to either be built up on the single-ended sampling capacitor (e.g., the set of switches is to the left) or to be discharged from the single-ended sampling capacitor (e.g., the set of switches is to the right). In this way, a first stage of the SDM 600 can be viewed as the current-to-current converter 401 and the first single-ended integrator 402 operating in a continuous-time mode, and a second stage of the SDM 600 can be viewed as the sampling capacitor (Csmp) and everything thereafter, coupled to the right of the sampling capacitor, operating in a discrete-time mode. The continuous-time mode of operation may enable the first single-ended integrator 402 to reduce sensitivity at the aliasing frequency and operate at higher frequencies.

In some embodiments, the logic 440 includes a first AND gate 442 having inputs including the balancing signal and the output of the latch 430. An output of the first AND gate 442 can be coupled to the second switch (S2) and the fourth switch (S4), e.g., to apply a positive balancing signal (Bal_p) to S2 and S4 (see FIG. 5). The logic 440 can further include an inverter 448 coupled to the output of the latch 430 and a second AND gate 444 having inputs including the balancing signal (Bal) and an output of the inverter 448. In embodiments, an output of the second AND gate 44 is coupled to the first switch (S1) and the fifth switch (S5), e.g., to apply a negative balancing signal (Bal_n) to S1 and S5 (see FIG. 5). By cross-coupling the outputs of the AND gate to the pair of balancing switches of each balancing circuit, the balancing currents (Ibal1 and Ibal2) have an opposing polarity.

In this way, the output of the latch 430 determines the direction of balancing that is ordered to compensate the integrator voltage. The SDM 400 can form a feedback loop delay of one period of Fmod caused by sampling and latching of the signal. In embodiments, the delay causes the SDM data to fluctuate, which is useful for data filtering and allows for increased resolution. The signal transfer coefficient from the first to the second single-ended integrators 402 and 412 can affect the shape of the quantization noise spectrum and is determined by Csmp/Cint2, e.g., where the optimal value can be 0.5 if Cint1/Cbal1=Cint2/Cbal2).

In embodiments, the first and second balancing capacitors (Cabal1 and Cbal2) are discharged during the sample cycle by closing third and sixth switches S3, S6 controlled by the sample signal (Sample). After that, these sampling capacitors are ready to generate balancing charge. The polarity of the balancing charge depends on the state of the latch 430, as was described. In embodiments, positive charge is generated by closing switches S1, S4, and the negative charge is generated by closing switches S2, S5 on period of Bal signal. Polarity of balancing circuits of the first and second single-ended integrators 402 and 412 can be opposite because the first and second operational amplifiers 404 and 414 function like two inverters and maintaining data signal integrity at the output. The value of the charge generated by each balancing circuit can be expressed as $$Qbal = Vref \cdot Cbal \quad (1)$$

The voltage of each integrator changes under the action of the balancing charge by an amount equal to $$\Delta Vint = Vref \cdot Cbal / Cint \quad (2)$$

The maximum current that does not saturate the SDM 400 is less than the equivalent current that the balancing circuit can generate, and can be expressed as:

$$Iin\_max = Vref \cdot Cbal1 \cdot Fmod / Att \quad (3)$$

In some embodiments, as illustrated, the SDM 400 can reduce the 20 switches of a conventional SDM to only eight switches and also a corresponding reduction in capacitors.

Figure 6:
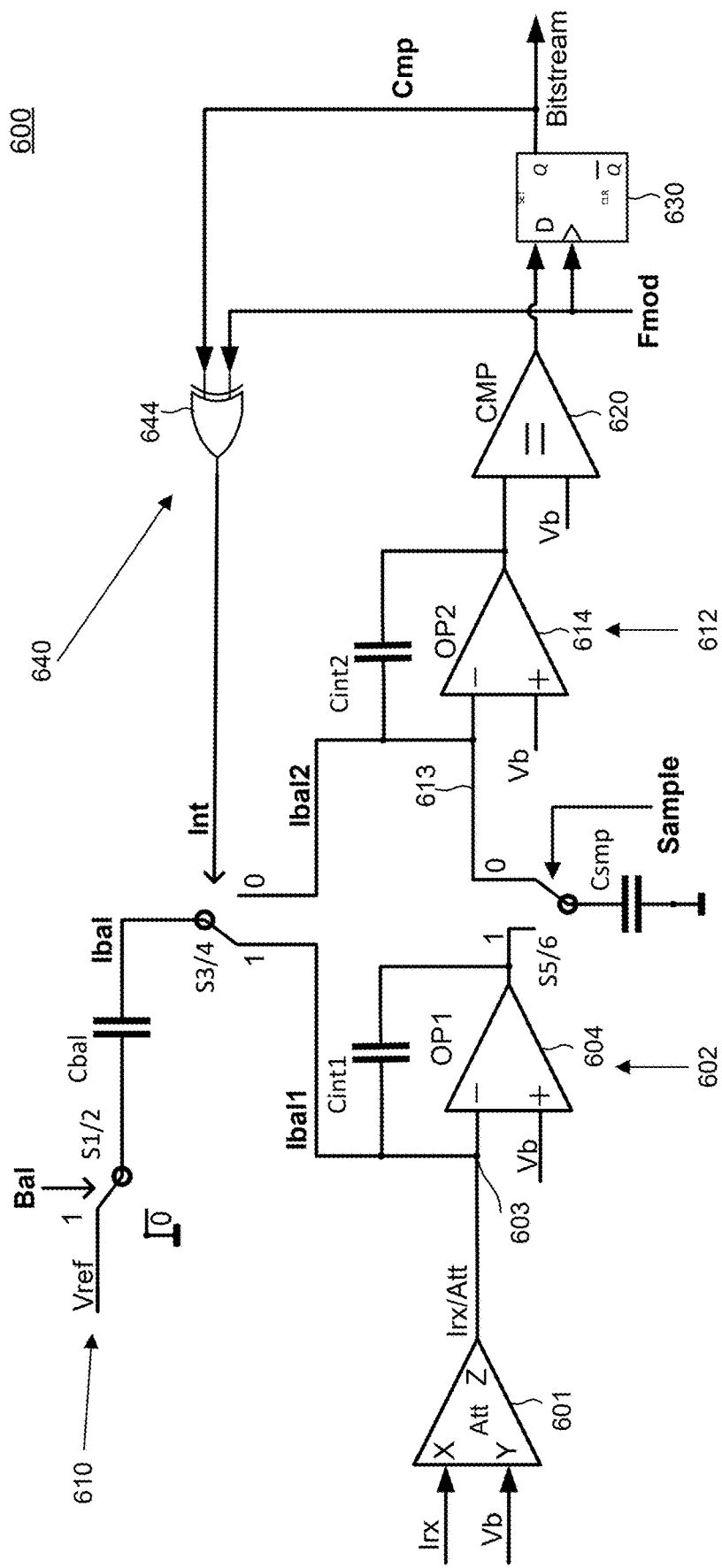
FIG. 6 is a schematic diagram of an SDM, designed with a single-ended architecture, which can be employed in the analog frontend according to at least another embodiment.
Figure 7:
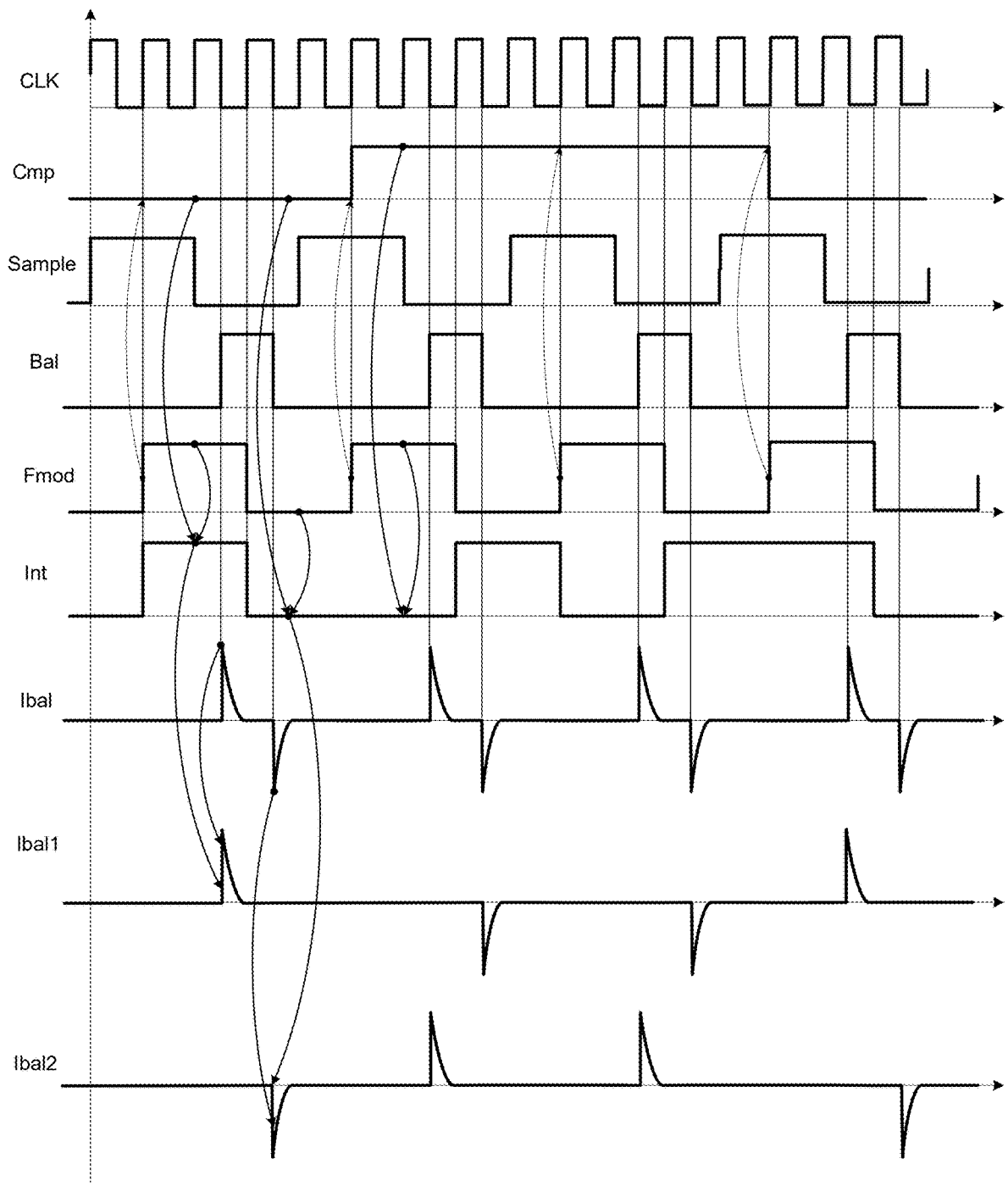
FIG. 7 is a timing diagram graph illustrating waveforms of various operational signals of the SDM of FIG. 6 according to some embodiments.

FIG. 6 is a schematic diagram of an SDM 600, designed with a single-ended architecture, which can be employed in the analog frontend 300 according to at least another embodiment. FIG. 7 is a timing diagram graph illustrating waveforms of various operational signals of the SDM 600 of FIG. 6 according to some embodiments. In embodiments, by observing functionality of the SDM 400 of FIG. 4-5, polarities for balancing charges are opposite for balancing each of the first and second single-sided integrators 402 and 412. This is because the operational amplifiers are inverting and provides an opposing polarity by which the SDM design can further be simplified. In some embodiments, this may be performed by consolidating the balancing circuits to a single balancing circuit.

More specifically, the SDM 600 can include a first single-ended integrator 602 and a second single-ended integrator 612 selectively coupled to an output of the first single-ended integrator 602. In embodiments, the SDM 600 includes a latch 630 (e.g., a D-latch) coupled to an output of the second single-ended integrator 612 and driven by a frequency modulation signal (Fmod). The SDM 600 can further include a balancing circuit 610 selectively coupled to a first input 603 of the first single-ended integrator 602 and to a second input 613 of the second single-ended integrator 612. For example, the balancing circuit 610 can selectively generate both a first balancing current (Ibal) provided to the first input 603 and a second balancing current (Ibal2) provided to the second input 613.

In embodiments, the SDM 600 further includes logic 640 coupled to the balancing circuit 610. In embodiments, the logic 640 causes, based on the frequency modulation (Fmod) signal and an output value of the latch 630, the balancing circuit 610 to either apply a positive balancing current to the first input 603 and a negative balancing current to the second input 613 or apply a positive balancing current to the second input 613 and a negative balancing current to the first input 603.

In at least some embodiments, the SDM 600 includes a current-to-current converter 601 (e.g., an attenuator) coupled to the receive electrode of the touch screen sensor 320. In embodiments, the first single-ended integrator 602 is coupled to the current-to-current converter 601, which scales the sensor current to a dynamic range of the SDM 600. This enables the use of one value of balancing capacitors Cbal1 and Cbal2 in the SDM 600 with an ability to tune an attenuation value of the current-to-current converter 601.

In at least some embodiments, the first single-ended integrator 602 includes a first operational amplifier 604 with a non-inverting terminal coupled to a bias voltage (Vb) and a first integrating capacitor (Cint1) coupled between an output and an inverting terminal of the first operational amplifier 604. In embodiments, the bias voltage (Vb) may be a base voltage that sets the operational amplifier voltage that ensures a swing of output voltage in a linear range. In some embodiments, the second single-ended integrator 612 includes a second operational amplifier 614 with a non-inverting terminal coupled to the bias voltage (Vb) and a second integrating capacitor (Cint2) coupled between an output and an inverting terminal of the second operational amplifier 614.

In embodiments, the SDM 600 further includes a comparator 620 coupled between the output of the second single-ended integrator 612 and an input to the latch 630. In embodiments, the latch 630 is driven by Fmod. Thus, the latch 630, at the rising edge of the Fmod signal (see FIG. 7), can store the result of comparing the integrator voltage with Vb or indicates whether the integrator voltage is greater or less than Vb.

Since integrators are known to be balanced by charges of opposite polarity, the SDM 600 can employ the switching of a balancing capacitor between the reference voltage and ground to generate a charge of the same value but opposite polarity after each switching. Specifically, in some embodiments, the balancing circuit 610 includes a balancing capacitor (Cbal), a first set of switches (S1/2) to selectively couple a first side of the balancing capacitor between a reference voltage (Vref) and ground. A second set of switches (S3/4) can selectively couple a second side of the balancing capacitor between the first input 603 and the second input 613.

In some embodiments, the logic 640 includes an XOR gate 644 having inputs including the frequency modulation signal (or Fmod) and the output value of the latch 630. In embodiments, an output (integrator signal or Ing) of the XOR gate 644 is coupled to the second set of switches (S3/4). In this way, the logic 640 can toggle the second set of switches (S3/4) to switch between supplying Ibal1 to the first input 603 of the first single-sided integrator 602 and supplying Ibal2 to the second input 613 of the second single-sided integrator 612. Thus, as can be seen in FIG. 7, Ibal1 and Ibal2 are applied consecutively (not currently like in the SDM 400), but still in opposing polarity. Also, the consecutive application of Ibal1 and Ibal2 is sufficiently close in time, e.g., coinciding with transitions in the balancing signal (Bal), to provide opposing balancing impacts similarly as done with architecture of the SDM 400 (FIGS. 4-5).

In some embodiments, the SDM 600 includes a single-ended sampling capacitor (Csmp) and a third set of switches (S5/6) coupled between the first and second single-ended integrators 602 and 612 and the single-ended sampling capacitor (Csmp). In embodiments, a sample signal (Sample) directs the set of switches (S5/6) to charge the single-ended sampling capacitor from the first single-ended integrator 602 and discharge the single-ended sampling capacitor through the second single-ended integrator 612.

In embodiments, the decision about which integrator should be balanced by the first positive charge and which by the second negative charge is made by the voltage of the second single-ended integrator 612, e.g., using the compare (CMP) signal that depends on the output of the second single-ended integrator 612. The second pair of switches (S3/4) can then send the Ibal current to either the first single-ended integrator 602 or the second single-ended integrator 612 based on the output of the comparator 620, e.g., the CMP output (e.g., CMP signal in FIGS. 6-7) and the Fmod signal, which provides clock timing (see CLK signal in FIG. 7). Accordingly, there are only six switches in the design of the SDM 600 and still fewer capacitors, an improvement over the SDM 400 of FIG. 4.

With additional reference to FIG. 7, in embodiments, the signals Sample, Bal, and Fmod can all be generated by circuitry a priori, e.g., and thus can be considered to be constant or fixed signals, driven by timing elsewhere in the analog frontend 300. As in the SDM 400, operation can be divided into two phases, which are determined by the sample signal (Sample). When the sample signal is high, the sampling capacitor (Csmp) is connected to the output of the first single-sided integrator 602, and when it is low, the charge from the sampling capacitor (Csmp) is transferred to the second single-sided integrator 612. Further, there is no need for precise voltage between Vref and bias voltage (Vb) for the single-ended integrators. Thus, the value of the bias voltage may be unimportant in this design.

In embodiments, balancing is performed during the period when the sampling signal is low (signal Bal). The Bal signal controls the first set of switches (S1/2), which switches the balancing capacitor (Cbal) from the ground node to Vref and back. Since one of the terminals of the balancing capacitor is always connected to the input of one of the single-ended integrators whose voltages are the same, switching the balancing capacitor generates a bipolar current (Ibal) through the balancing capacitor. This balancing current is applied to one of the single-ended integrators by the second set of switches (S3/4), which is controlled by the integrator (or Int) signal. This signal is XOR of the Fmod signal and the state of the CMP signal from the comparator 620 captured in the previous balancing cycle. The Fmod signal can determine the switching moment, while the CMP signal determines the switching sequence, e.g., using signals Fmod, CMP, Ibal1, Ibal2. Due to the reduced complexity for this design, the speeds of the operational amplifiers of the single-ended integrators may need to be a little faster for more precise switching when the balancing current is applied. For example, there can be expected faster settling times with fewer switches and capacitors.

Figure 8:
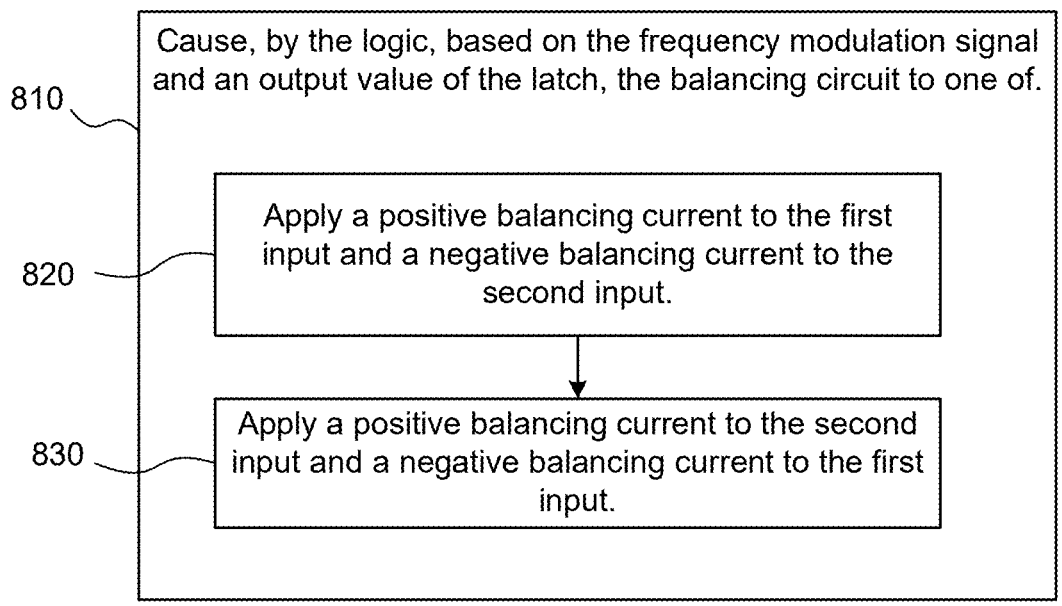
FIG. 8 is a flow diagram of a method of operating an integrated circuit with the disclosed SDM according to at least one embodiment.

FIG. 8 is a flow diagram of a method 800 of operating an integrated circuit with the disclosed SDM 600 according to at least one embodiment. The method 800 can be performed at least in part by processing logic that includes hardware (e.g., circuitry, dedicated logic, programmable logic, microcode, etc.), firmware, or a combination thereof. In one example embodiment, the method 800 is performed by the analog frontend circuitry such as any SDM 135, 318, 400, 600, 900, or 1100 of FIG. 1, FIG. 3, FIG. 4, FIG. 6, FIG. 9, or FIG. 11, respectively. Although illustrated in a particular order, the operations of the method 800 need not be performed in a particular order unless expressly or inherited described in a certain order.

At operation 810, logic of the SDM 600 causes, based on the frequency modulation signal and an output value of the latch, the balancing circuit to perform operation 820 or operation 830.

At operation 820, the logic applies a positive balancing current to the first input and a negative balancing current to the second input.

At operation 830, logic applies a positive balancing current to the second input and a negative balancing current to the first input.

In some embodiments, as discussed, the SDM 600 includes the single-ended sampling capacitor (Csmp) and the third set of switches (S5/6) coupled between the first and second single-ended integrators and the single-ended sampling capacitor. In these embodiments, the logic 640 causes the third set of switches to charge the single-ended sampling capacitor from the first single-ended integrator 602. In these embodiments, the logic causes the third set of switches to discharge the single-ended sampling capacitor through the second single-ended integrator 612.

In some embodiments, the balancing circuit 610 includes, as discussed, the balancing capacitor (Cbal), a first set of switches (S1/2) coupled between a reference voltage and ground and a first side of the balancing capacitor, and a second set of switches (S3/4) coupled between a second side of the balancing capacitor and the first input 603 and the second input 613. In these embodiments, the method further includes causing, by a balancing signal (Bal), the first set of switches to toggle between applying the reference voltage or ground to the first side of the balancing capacitor and causing, by the logic, the second set of switches to toggle between applying the second side of the capacitor to one of the first input 603 or the second input 613.

Figure 9:
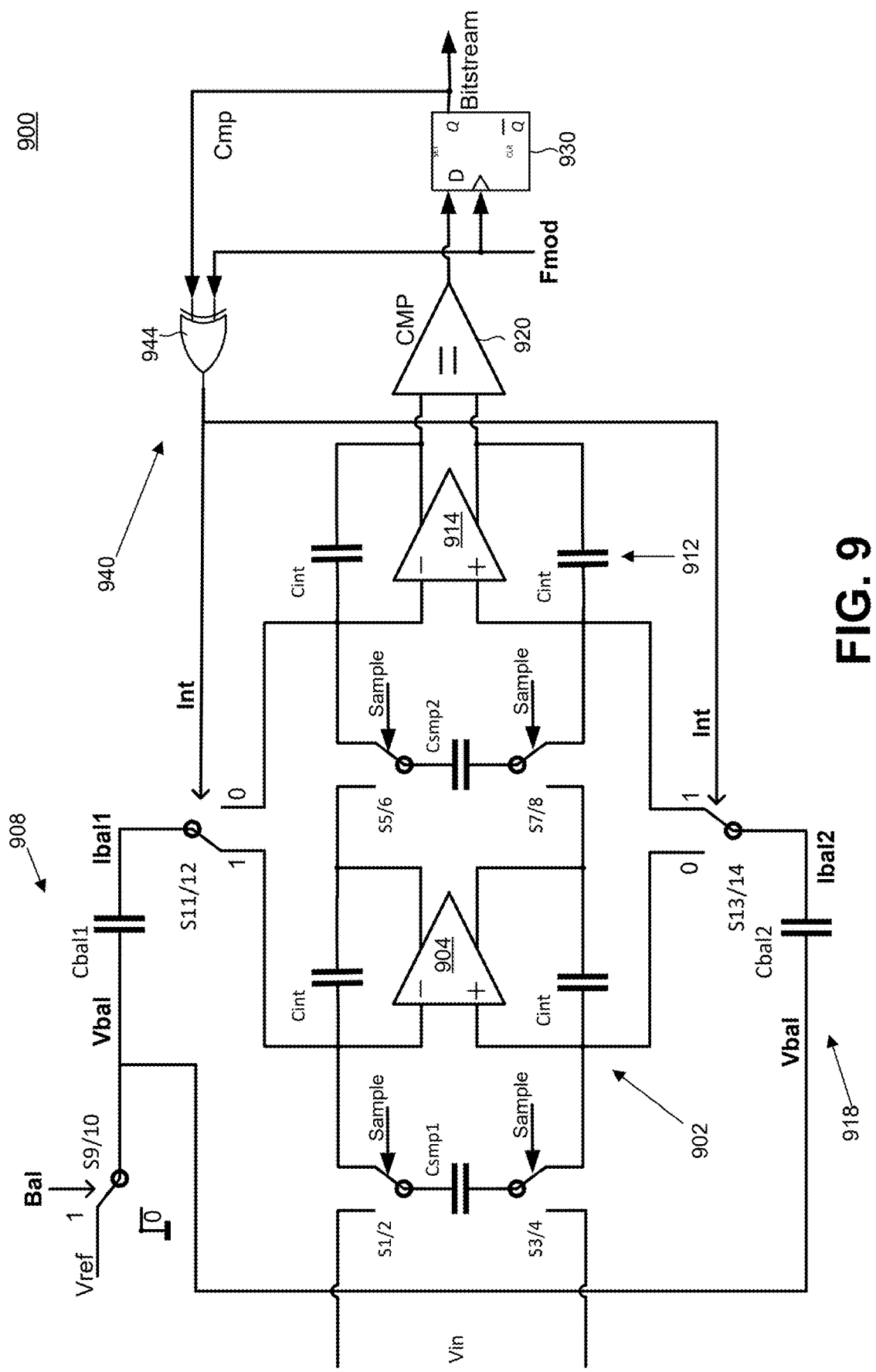
FIG. 9 is a schematic diagram of a sigma-delta modulator (SDM), designed with a differential architecture, which can be employed in the analog frontend according to at least one embodiment.
Figure 10:
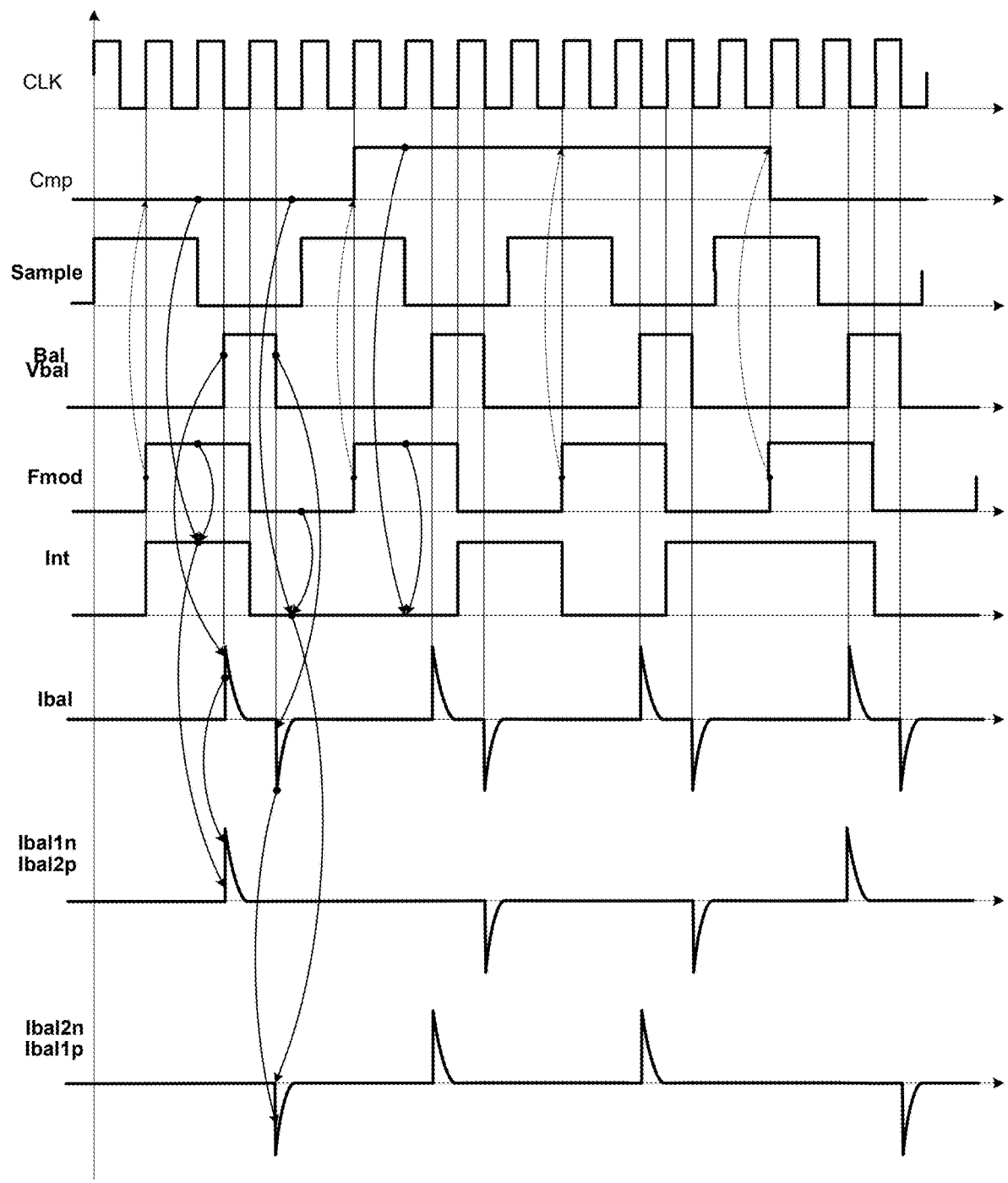
FIG. 10 is a timing diagram graph illustrating waveforms of various operational signals of the SDM of FIG. 9 according to some embodiments.

FIG. 9 is a schematic diagram of a sigma-delta modulator (SDM) 900, designed with a differential architecture, which can be employed in the analog frontend 300 according to at least one embodiment. FIG. 10 is a timing diagram graph illustrating waveforms of various operational signals of the SDM 900 of FIG. 9 according to some embodiments. In embodiments where the architecture is differential rather than single-ended, the implementations of FIGS. 6-7 may be adapted to a differential architecture with an overall savings in the number of capacitors and switches, and thus a savings in overall silicon area on chip. The particular embodiments of FIGS. 9-10, the SDM 900 is a second order, discrete-time SDM.

For example, in some embodiments, the SDM 900 includes a first differential integrator 902 selectively coupled to a first sampling capacitor (Csmp1) and a second differential integrator 912 selectively coupled to a second sampling capacitor (Csmp2). In embodiments, the first differential integrator 902 includes a first operational amplifier 904 and an integrating capacitor (Cint) coupled across each of the non-inverting and inverting terminals. The first sampling capacitor can be selectively coupled to both non-inverting and inverting terminals of the first operational amplifier 904 and to voltage input terminals of the SDM 900, e.g., via a first set of switches (S1/2) and a second set of switches (S3/4) connected to each side of the first sampling capacitor.

In embodiments, the second differential integrator 912 includes a second operational amplifier 914 and an integrating capacitor (Cint) coupled across each of the non-inverting and inverting terminals. The second sampling capacitor may be selectively coupled, via a third set of switches (S5/6) and a fourth set of switches (S7/8), to both non-inverting and inverting terminals of the second operational amplifier 914, and to the integrating capacitors (Cint) of the first operational amplifier 904.

In some embodiments, the SDM 900 includes a latch 930 (e.g., a D-latch) coupled to an output of the second differential integrator 912 and driven by a frequency modulation signal (Fmod). In embodiments, the SDM 900 includes a comparator 920 coupled between the output of the second differential integrator 914 and the latch 930. Thus, the output value of the second single-ended integrator 612 can be stored in the latch 630 at the rising edge of the Fmod signal (see FIG. 10).

In some embodiments, the SDM 900 includes a first balancing circuit 908 selectively coupled between the inverting terminals of each of the first and second differential integrators 902 and 912, e.g., of the first and second operational amplifiers 904 and 914. The first balancing circuit 908 can include a fifth set of switches (S9/10) to selectively couple a first side of a first balancing capacitor (Cbal1) between a reference voltage (Vref) and ground. The first balancing circuit 908 can further include a sixth set of switches (S11/12) to selectively couple a second side of the first balancing capacitor between the inverting terminals of the first and second operational amplifiers 904 and 912.

In some embodiments, the SDM 900 includes a second balancing circuit 918 selectively coupled between non-inverting terminals of each the first and second differential integrators 902 and 912, e.g., of the first and second operational amplifiers 904 and 914. The second balancing circuit 918 can also employ the fifth set of switches (S9/10) to selectively couple a first side of a second balancing capacitor (Cbal2) between the reference voltage (Vref) and ground. The first balancing circuit 908 can further include a seventh set of switches (S13/14) to selectively couple a second side of the second balancing capacitor between the non-inverting terminals of the first and second operational amplifiers 904 and 914.

In this way, the first and second balancing capacitors (Cbal1 and Cbal2) are recharged by switching the fifth set of switches (S9/10). In embodiments, the sixth set of switches (S11/12) and the seventh set of switches (S13/14) work in opposite phase, e.g., if S11/12 selects the first differential integrator 902, then S13/14 selects the second differential integrator 912, and vice versa. The timing diagram of FIG. 10 is substantially the same as that of FIG. 7, but includes slightly different signal designators. For example, the "n" may designate "negative" current and the "p" may designate positive current on either of the first balance current (Ibal1) or second balance current (Ibal2) coming from the first and second balancing circuits 908 and 918, respectively.

In at least some embodiments, the decision about which integrator should be balanced by a positive charge and which by a negative charge (e.g., from Ibal1 and Ibal2 currents) is made by the voltage of the second differential integrator 912, e.g., using the compare (CMP) signal that depends on the output of the second differential integrator 912. More specifically, a logic 940 can toggle an output value based on the CMP signal and the Fmod signal, which generates an integrator signal (Int) used to control the sixth pair of switches (S11/12) and the seventh pair of switches (S13/14).

More specifically, in some embodiments, the sixth pair of switches (S11/12) can send the first balance current (Ibal1) to either the first differential integrator 902 or the second differential integrator 912 based on the Int signal, which depends on the output of the comparator 620, e.g., the CMP output (e.g., CMP signal in FIGS. 9-10) and the Fmod signal, which provides clock timing (see CLK signal in FIG. 10). Further, the seventh pair of switches (S13/14) can send the second balance current (Ibal2) to either the second differential integrator 914 or the first differential integrator 902 based on the same Int signal, which depends on the CMP output and the Fmod signal, but to the opposite differential integrator than Ibal1 because the sixth and seventh switches are arranged with opposite polarity.

In some embodiments, the logic 940 includes an XOR gate 944 having inputs including the frequency modulation signal (or Fmod) and the output value of the latch 930. In embodiments, an output (Int) of the XOR gate 644 is coupled to the sixth and seventh sets of switches (S11/12 and S13/14). In this way, the logic 640 can toggle the sixth and seventh sets of switches to switch between supplying Ibal1 to the first differential integrator 902 and Ibal2 to the second differential integrator 912 and supplying Ibal1 to the second differential integrator 912 and Ibal2 to the first differential integrator 902.

With additional reference to FIG. 10, in embodiments, the signals Sample, Bal, and Fmod can all be generated by circuitry a priori, e.g., and thus can be considered to be constant or fixed signals, driven by timing elsewhere in the analog frontend 300, e.g., based on a circuit clock (CLK). In embodiments, balancing is performed during the period when the sampling signal is low (signal Bal). The Bal signal controls the fifth set of switches (S9/10), which switches the first balancing capacitor (Cbal1) and the second balancing capacitor (Cbal2) from the ground node to Vref and back. Since one of the terminals of each balancing capacitor is always connected to the input of one of the differential integrators, switching the balancing capacitors generates a bipolar current between the first and second balance currents (Ibal1 and Ibal2). These balancing currents can be applied to the first and second differential integrators 902 and 912 as illustrated in FIG. 10 by the six and seventh sets of switches (S11/12 and S13/14), which is controlled by the Int signal. This signal is XOR of the Fmod signal and the state of the CMP signal from the comparator 920 captured in the previous balancing cycle. The Fmod signal can determine the switching moment, while the CMP signal determines the switching sequence, e.g., using signals Fmod, CMP, Ibal1, Ibal2.

Figure 11:
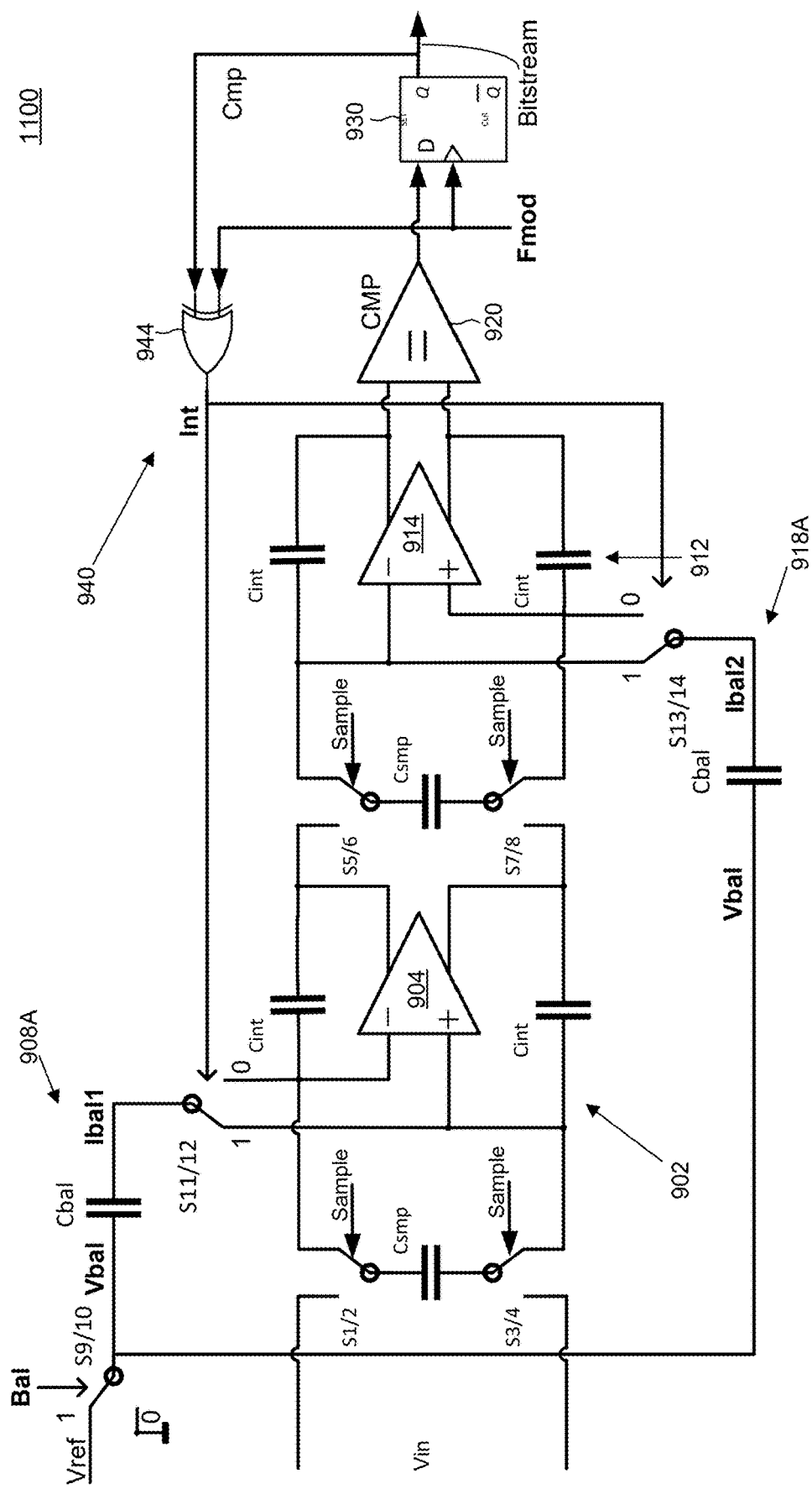
FIG. 11 is a schematic diagram of a sigma-delta modulator (SDM), designed with a differential architecture, which can be employed in the analog frontend according to at least one embodiment.
Figure 12:
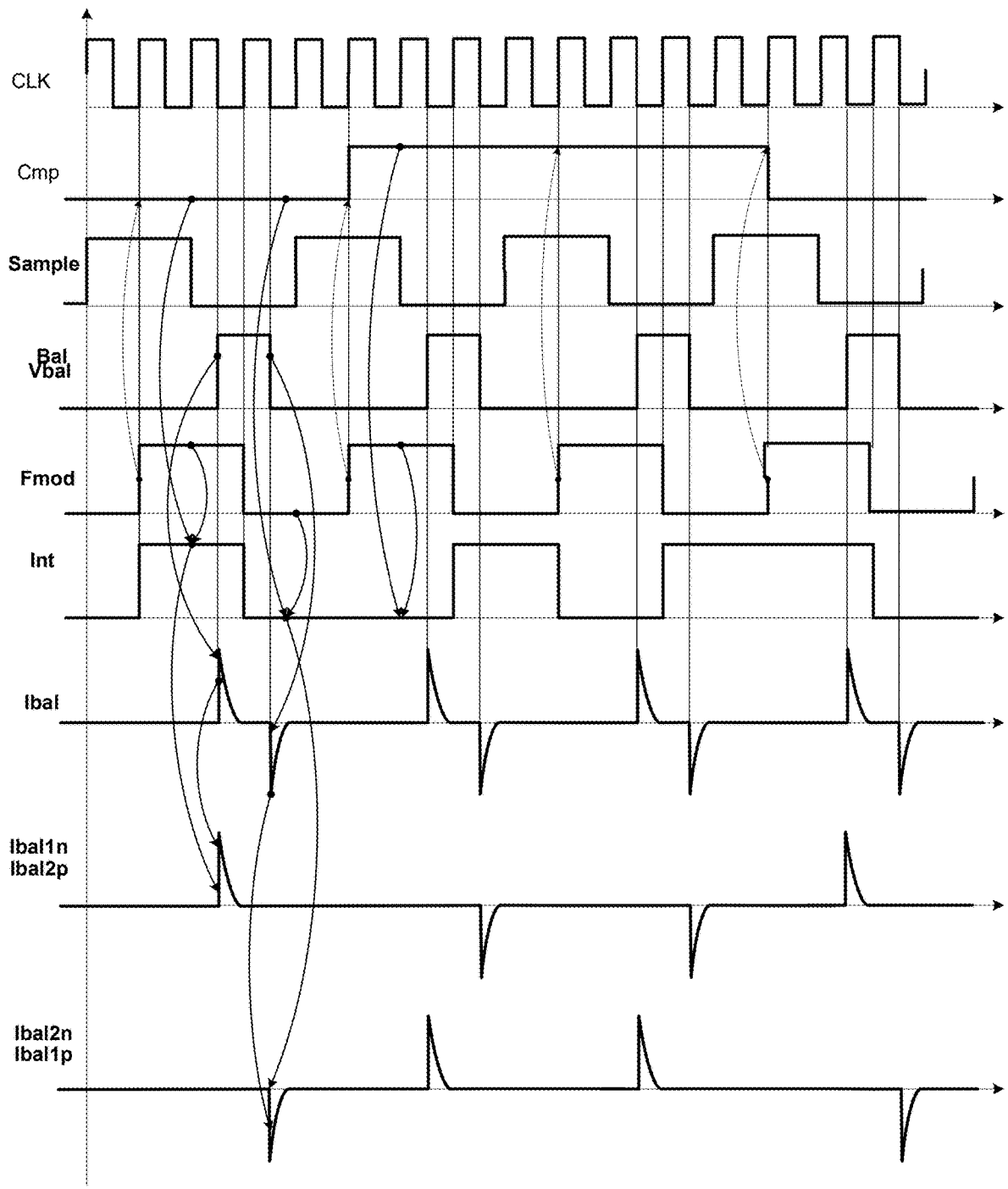
FIG. 12 is a timing diagram graph illustrating waveforms of various operational signals of the SDM of FIG. 11 according to some embodiments.

FIG. 11 is a schematic diagram of a sigma-delta modulator (SDM) 1100, designed with a differential architecture, which can be employed in the analog frontend 300 according to at least one embodiment. FIG. 12 is a timing diagram graph illustrating waveforms of various operational signals of the SDM of FIG. 11 according to some embodiments. In embodiments, where the architecture is differential rather than single-ended, the implementations of FIGS. 6-7 may be adapted to a differential architecture with an overall savings in the number of capacitors and switches, and thus a savings in overall silicon area on chip. The particular embodiments of FIGS. 11-12, the SDM 1100 is a second order, discrete-time SDM.

In some embodiments, the SDM 1100 of FIGS. 11-12 is structurally similar to the SDM 900 of FIGS. 9-10, but the SDM 1100 includes a first balancing circuit 908A and a second balancing circuit 918A that are coupled differently. Specifically, the sixth set of switches (S11/12) can be coupled to the non-inverting and inverting terminals of the first operational amplifier 904 and the seventh set of switches (S13/14) can be coupled to the inverting and non-inverting terminals of the second operational amplifier 914. Thus, the Ibal1 and Ibal2 currents can be inverted in polarity by being alternatively applied between the inverting and non-inverting terminals of the operational amplifiers. More specifically, when Ibal1 is applied to the non-inverting terminal of the first operational amplifier 904, Ibal2 can be applied to the inverting terminal of the second operational amplifier 914. Similarly, when Ibal1 is applied to the inverting terminal of the first operational amplifier 904, Ibal2 can be applied to the non-inverting terminal of the second operational amplifier 914. Otherwise, the functionality and signaling of the SDM 1100 substantially matches that of the SDM 900.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "communicating," "modifying," "measuring," "determining," "sending," "comparing," "maintaining," "switching," "controlling," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An integrated circuit comprising:
a sigma-delta modulator coupled to a receive electrode of a capacitive touch screen sensor, wherein the sigma-delta modulator comprises:
a first single-ended integrator;
a second single-ended integrator selectively coupled to an output of the first single-ended integrator;
a latch coupled to an output of the second single-ended integrator and driven by a frequency modulation signal;
a balancing circuit selectively coupled to a first input of the first single-ended integrator and to a second input of the second single-ended integrator; and
logic coupled to the balancing circuit, the logic to cause, based on the frequency modulation signal and an output value of the latch, the balancing circuit to one of:
apply a positive balancing current to the first input and a negative balancing current to the second input; or
apply a positive balancing current to the second input and a negative balancing current to the first input.

2. The integrated circuit of claim 1, further comprising a current-to-current converter coupled to the receive electrode, wherein the first single-ended integrator is coupled to the current-to-current converter.

3. The integrated circuit of claim 1, further comprising a comparator coupled between the output of the second single-ended integrator and an input to the latch.

4. The integrated circuit of claim 1, wherein each of the first and second single-ended integrators comprises:
an operational amplifier with a non-inverting terminal coupled to a bias voltage; and
an integrating capacitor coupled between an output and an inverting terminal of the operational amplifier.

5. The integrated circuit of claim 1, further comprising:
a single-ended sampling capacitor; and
a set of switches coupled between the first and second single-ended integrators and the single-ended sampling capacitor, wherein a sample signal directs the set of switches to charge the single-ended sampling capacitor from the first single-ended integrator and discharge the single-ended sampling capacitor through the second single-ended integrator.

6. The integrated circuit of claim 1, wherein the balancing circuit comprises:
a balancing capacitor;
a first set of switches to selectively couple a first side of the balancing capacitor between a reference voltage and ground; and
a second set of switches to selectively couple a second side of the balancing capacitor between the first input and the second input.

7. The integrated circuit of claim 6, wherein the logic comprises an XOR gate having inputs comprising the frequency modulation signal and the output value of the latch, wherein an output of the XOR gate is coupled to the second set of switches.

8. An integrated circuit comprising:
a sigma-delta modulator coupled to a receive electrode of a capacitive touch screen sensor, wherein the sigma-delta modulator comprises:
a first single-ended integrator;
a first balancing circuit coupled to a first input of the first single-ended integrator;
a second single-ended integrator selectively coupled to an output of the first single-ended integrator;
a second balancing circuit coupled to a second input of the second single-ended integrator;
a latch coupled to an output of the second single-ended integrator; and
logic coupled between an output of the latch and a pair of balancing switches of each of the first and second balancing circuits, wherein the logic is to cause, based on values of a bitstream at the output of the latch and on a balancing signal:
the first balancing circuit to apply a first balancing current to the first input; and
the second balancing circuit to apply a second balancing current, having an opposite polarity to that of the first balancing current, to the second input.

9. The integrated circuit of claim 8, further comprising a current-to-current converter coupled to the receive electrode, wherein the first single-ended integrator is coupled to the current-to-current converter.

10. The integrated circuit of claim 8, further comprising a comparator coupled between the output of the second single-ended integrator and an input to the latch, wherein the latch is driven by a frequency modulation signal.

11. The integrated circuit of claim 8, wherein each of the first and second single-ended integrators comprises:
an operational amplifier with a non-inverting terminal coupled to a reference voltage; and
an integrating capacitor coupled between an output and an inverting terminal of the operational amplifier.

12. The integrated circuit of claim 8, wherein the first balancing circuit comprises:
a first switch coupled to a reference voltage;
a second switch coupled to ground, wherein the first and second switches are the pair of balancing switches; and
a balancing capacitor coupled between the first and second switches and the first input.

13. The integrated circuit of claim 12, further comprising:
a single-ended sampling capacitor selectively coupled between the first and second single-ended integrators;
a third switch coupled between the first switch and the first input; and
a set of switches coupled between the second input, the single-ended sampling capacitor, and an output of the first single-ended integrator, and wherein a sample signal is applied to the third switch and the set of switches.

14. The integrated circuit of claim 12, wherein the logic comprises:
a first AND gate having inputs comprising the balancing signal and the output of the latch, wherein an output of the first AND gate is coupled to the second switch;

an inverter coupled to the output of the latch; and a second AND gate having inputs comprising the balancing signal and an output of the inverter, wherein an output of the second AND gate is coupled to the first switch.

15. The integrated circuit of claim 8, wherein the second balancing circuit comprises:
a first switch coupled to a reference voltage;
a second switch coupled to ground, wherein the first and second switches are the pair of balancing switches; and
a balancing capacitor coupled between the first and second switches and the second input.

16. The integrated circuit of claim 15, further comprising:
a single-ended sampling capacitor selectively coupled between the first and second single-ended integrators;
a third switch coupled between the first switch and the second input; and
a set of switches coupled between the second input, the single-ended sampling capacitor, and an output of the first single-ended integrator, and wherein a sample signal is applied to the third switch and the set of switches.

17. The integrated circuit of claim 15, wherein the logic comprises:
a first AND gate having inputs comprising the balancing signal and the output of the latch, wherein an output of the first AND gate is coupled to the first switch;
an inverter coupled to the output of the latch; and
a second AND gate having inputs comprising the balancing signal and an output of the inverter, wherein an output of the second AND gate is coupled to the second switch.

18. A method of operating sigma-delta modulator comprising a first single-ended integrator; a second single-ended integrator selectively coupled to an output of the first single-ended integrator; a latch coupled to an output of the second single-ended integrator and driven by a frequency modulation signal; a balancing circuit selectively coupled to a first input of the first single-ended integrator and to a second input of the second single-ended integrator; and control logic coupled to the balancing circuit, wherein the method comprises:
causing, by the logic, based on the frequency modulation signal and an output value of the latch, the balancing circuit to one of:
apply a positive balancing current to the first input and a negative balancing current to the second input; or
apply a positive balancing current to the second input and a negative balancing current to the first input.

19. The method of claim 18, wherein the sigma-delta modulator further comprises a single-ended sampling capacitor and a set of switches coupled between the first and second single-ended integrators and the single-ended sampling capacitor, the method further comprising:
causing the set of switches to charge the single-ended sampling capacitor from the first single-ended integrator; and
causing the set of switches to discharge the single-ended sampling capacitor through the second single-ended integrator.

20. The method of claim 18, wherein the balancing circuit comprises a balancing capacitor, a first set of switches coupled between a reference voltage and ground and a first side of the balancing capacitor, and a second set of switches coupled between a second side of the balancing capacitor and the first input and the second input, the method further comprising:
causing, by a balancing signal, the first set of switches to toggle between applying the reference voltage or ground to the first side of the balancing capacitor; and
causing, by the logic, the second set of switches to toggle between applying the second side of the capacitor to one of the first input or the second input.

* * * * *